(12) United States Patent
Jung et al.

(10) Patent No.: US 7,666,525 B2
(45) Date of Patent: Feb. 23, 2010

(54) ORGANIC ELECTROLUMINESCENT DEVICE COMPRISING A POLYMER LAYER CONTAINING A POLYIMIDE HAVING TRIPHENYLAMINE DERIVATIVE UNIT

(75) Inventors: Myung-Sup Jung, Seongnam-si (KR); Byung-Hee Sohn, Yongin-si (KR); Tae-Woo Lee, Seoul (KR)

(73) Assignee: Samsung Mobile Display Co., Ltd., Giheung-Gu, Yongin, Gyunggi-Do (KR)

(*) Notice: Subject to any disclaimer, the term of this patent is extended or adjusted under 35 U.S.C. 154(b) by 472 days.

(21) Appl. No.: 11/315,221

(22) Filed: Dec. 23, 2005

(65) Prior Publication Data

US 2006/0147736 A1 Jul. 6, 2006

(30) Foreign Application Priority Data

Dec. 31, 2004 (KR) .................. 10-2004-0117962

(51) Int. Cl.
*H01L 51/54* (2006.01)
*H05B 33/14* (2006.01)
*C08G 73/10* (2006.01)

(52) U.S. Cl. .................. 428/690; 428/917; 313/504; 313/506; 257/40

(58) Field of Classification Search ............ 428/690, 428/917, 473.5; 313/502–509; 257/40
See application file for complete search history.

(56) References Cited

U.S. PATENT DOCUMENTS

2003/0098646 A1* 5/2003 Suh et al. .............. 313/504

FOREIGN PATENT DOCUMENTS

JP 09-298089 * 11/1997

OTHER PUBLICATIONS

Troadec et al., "Organic light-emitting diodes based on multilayer structures," Synthetic Metals, vol. 124, No. 1, pp. 49-51, Oct. 2001.*
Machine Translation of JP 09-298089.*
Oishi et al., "Preparation and properties of novel soluble aromatic polyimides from 4,4-diaminotriphenylamine and aromatic tetracarboxylic dianhydrides," Journal of Polymer Science Part A: Polymer Chemistry, vol. 30, No. 6, pp. 1027-1035, May 1992.*
Aleksandrova et al, "Polyimide structures with high charge-carrier mobility for electroluminescent devices and liquid-crystal light modulators," Journal of Optical Technology, vol. 68, No. 11, pp. 805-808, Nov. 2001.*
Rumyantsev et al, "Photoconducting polymer nanocomposites for photovoltaic applications," Voprosy Biologicheskoi, Meditsinskoi i Farmatsevtichescoi Khimii, vol. 4, pp. 22-26, 2004.*

(Continued)

Primary Examiner—D. Lawrence Tarazano
Assistant Examiner—Camie S Thompson
(74) Attorney, Agent, or Firm—Robert E. Bushnell, Esq.

(57) ABSTRACT

An organic EL device has a layer containing a polyimide having a triphenylamine derivative (TPD) unit. The use of the polyimide as a polymer layer material can ensure solvent selectivity in coating the light-emitting layer and the organic EL device exhibits good luminance efficiency even after a prolonged period use.

13 Claims, 6 Drawing Sheets

OTHER PUBLICATIONS

An article "The role of PI interlayer deposited by ionized cluster beam on the electroluminescence efficiency" written by Cho, et al. published in Thin Solid Films 417, pp. 175-179 in 2002.

An article "Spin-cast thin semiconducting poly mer interlayer for improving device efficiency of polymer light-emitting diodes" written by Kim, et al. published in Applied Physics Letters 87, in 2005.

* cited by examiner

ORGANIC ELECTROLUMINESCENT DEVICE COMPRISING A POLYMER LAYER CONTAINING A POLYMIDE HAVING TRIPHENYLAMINE DERIVATIVE UNIT

CROSS-REFERENCE TO RELATED PATENT APPLICATION AND CLAIM OF PRIORITY

This application claims the benefit of Korean Patent Application No. 10-2004-0117962, filed on Dec. 31, 2004, in the Korean Intellectual Property Office, the disclosure of which is incorporated herein in its entirety by reference.

BACKGROUND OF THE INVENTION

1. Field of the Invention

The present invention relates to an organic electroluminescent device comprising a polymer layer containing a polyimide (PI) having a triphenylamine derivative (TPD) unit.

2. Description of the Related Art

An organic electroluminescent (EL) device is an active drive type emission display device that operates under the principle that when current is applied to fluorescent or phosphorescent organic compound layers (referred to as "organic layers" hereinafter), electrons and holes are combined in the organic layers to then emit light. Organic EL devices have various advantages including being lightweight, simple components, having a simplified fabrication process, and offering a wide viewing angle. Also, organic EL devices can enable moving picture display perfectly with high color purity, and the devices have electrical properties suitable for portable electronic devices at low power consumption and low driving voltage.

A general organic EL device is constructed such that an anode is formed on a substrate, a hole transport layer, an emissive layer, an electron transport layer, and a cathode are sequentially formed on the anode. Here, the hole transport layer, the emissive layer, and the electron transport layer are organic layers made of organic compounds. The electroluminescence mechanism of a general organic EL device will now be described. When a voltage is applied between an anode and a cathode, holes are moved from an anode to an emissive layer via a hole transport layer, and electrons are moved from a cathode to the emissive layer via an electron transport layer. The electrons and holes meet in the emissive layer for recombination, forming excitons. The excitons are subjected to radiative decay, producing light having a wavelength corresponding to a band gap of an emissive layer forming material.

To date, there have been made various attempts to enhance emission efficiency and lifetime characteristics of the organic EL device, including the followings: 1) facilitating injection of electrons and/or holes; 2) increasing electron and/or hole mobility; 3) facilitating recombination of electrons and holes; and 4) increasing photo conversion efficiency.

To achieve the above stated goals, the following techniques are provided: 1) minimizing an energy barrier between an electrode and a transport layer; 2) increasing electron and/or hole mobility through cascade transport; 3) inducing a balanced current using a hetero-junction structure or a low mobility emitter; and 4) using a phosphorescent material and fluorescent/phosphorescent hybrid materials as light-emitting layers.

Another method of enhancing emission efficiency and lifetime characteristics of the organic EL device which has an organic layer structure comprised of a hole transport layer, a light-emitting layer, and an electron transport layer is to control injection, movement and recombination of electrons and holes by providing an polymer interlayer between the hole transport layer and the light-emitting layer.

In other words, the polymer interlayer serves as a buffer layer that prevents migration of sulfur from the hole transport layer, usually a stacked layer of PEDOT/PSS(poly(3,4-ethylenedioxythiophen)/polystyrene sulfonate), and prevents a PEDOT/PSS layer, which is a strongly acidic layer, from directly contacting with the light-emitting layer. In addition, the polymer interlayer prevents electrons and exitons from being induced into the PEDOT/PSS layer, thereby enhancing life characteristics of the organic EL device.

Cho, et al. proposed a polymeric EL device having a hole blocking layer into which PMDA-ODA type polyimide (PI) is injected to various thicknesses in various packing densities, as described in Thin Solid Films 417(2002) 175-179, "The role of PI interlayer deposited by ionized cluster beam on the electroluminescence efficiency" between an ITO electrode and a light-emitting layer made of BEH-PPV polymer using ionized cluster beam (ICB). Here, the PMDA-ODA type polyimide serves as a hole injection barrier that prevents impurities of the ITO electrode from being diffused into the inside of the polyimide layer, causing balanced recombination of holes and electrons. The above-referenced document discloses a PI layer serving to reduce a hole tunneling probability, rather than serving as an electron blocking layer, in order to provide an organic EL device with enhanced efficiency using balanced charge carriers.

Kim, et al. proposed a polymeric EL device (PLED) having a thin polymer interlayer between an PEDOT/PSS and a light-emitting layer, as described in Applied Physic Letter 87(2005), 023506, "Spin-cast thin semiconducting polymer interlayer for improving device efficiency of polymer light-emitting diodes". The thin interlayer blocks the radiative exitons from direct quenching by PEDOT-PSS and thus removes a nonradiative decay channel introduced by PEDOT-PSS. This exciton blocking property of conjugated polymer interlayer significantly improves the efficiency and lifetime of PLEDs. As a thin conjugated polymer interlayer, triphenylamine-based conjugated polymers, such as poly(9,9-dioctylfluorene-co-bis-N,N'-(4-butylphenyl)-bis-N,N'-phenyl-1,4-phenylenediamine) (PFB) and poly(9,9'-dioctylfluorene-co-N-(4-butylphenyl)diphenylamine) (TFB) can be used, since such polymers are semiconductors having a wide band gap, low ionization potential, and high hole mobility due to their triphenylamine groups in the polymer backbone. However, these conjugated polymers are readily soluble in the common organic solvents, such as toluene and xylene, which are also used for light emitting polymer process. Therefore, when the light-emitting polymer was spin-coated, the underlying spin-cast polymer interlayer was partially dissolved and then washed out by the solution of light emitting polymer, or intermixed with light emitting polymer. The thickness control of a thin conjugated polymer interlayer is, thus, fundamentally difficult, which is a serious problem for the practical use.

SUMMARY OF THE INVENTION

The present invention provides an organic EL device comprising a polymer layer polymer containing a polyimide having a TPD unit which is not soluble in a solvent used in coating of a light-emitting material and has electron and exciton blocking capability.

The present invention also provides a polyimide having a TPD unit used for a polymer layer in an organic EL device.

The present invention also provides a method of preparing a polyimide having a TPD unit.

According to an aspect of the present invention, there is provided an organic electroluminescent (EL) device comprising a polymer layer containing a polyimide having the triphenylamine derivative (TPD) unit.

According to another aspect of the present invention, there is provided an organic electroluminescent (EL) device comprising a polymer layer containing a polyimide represented by Formula 1 between an anode and a light emitting layer:

(1)

where X is a tetravalent aromatic hydrocarbon group, n is an integer of 1 to 10,000, and Y is where R1 and R2 are each independently a hydrogen or a monovalent $C_1$-$C_{15}$ organic group, W is a bond or where Ar is an aryl group, A is a bond or an aryl group, and Z is a bond or an arylenyl group.

According to another aspect of the present invention, there is provided a polyimide having a triphenylamine derivative (TPD) unit represented by Formula 2:

(2)

where X is a tetravalent aromatic hydrocarbon group, n is an integer of 1 to 10,000, and each R1 and each R2 are each independently a hydrogen or a monovalent $C_1$-$C_{15}$ organic group.

According to still another aspect of the present invention, there is provided a method of preparing a polyimide containing a triphenylamine derivative (TPD) unit represented by Formula 2, the method comprising reacting a tetracarboxylic dianhydride represented by Formula 3 with a triphenylamine derivative represented by Formula 4:

where X is a tetravalent aromatic hydrocarbon group, n is an integer from 1 to 10,000, and each R1 and each R2 are each independently a hydrogen or a monovalent $C_1$-$C_{15}$ organic group.

The polymer layer comprising the polyimide (PI) having a triphenylamine derivative (TPD) unit according to the present invention has excellent mechanical strength and thermal stability, thus demonstrating various advantages, including good film forming performance, high planarity and excellent solvent selectivity, enabling the organic EL device containing the same to exhibit a good lifetime characteristic.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Hereinafter, the embodiments of the present invention will be described in detail with reference to the accompanying drawings.

The present invention provides an organic electroluminescent (EL) device comprising a polymer layer containing a polyimide having the triphenylamine derivative (TPD) unit.

Since the polyimide may serve as a buffer layer preventing a hole transfer layer or a hole injection layer from directly contacting with the light-emitting layer, and the polyimide may prevent electrons from being injected into the hole transport layer, thereby effectively preventing electrons from migrating from the light-emitting layer to the hole transport layer.

Accordingly, the polymer layer may be formed between an anode (or a hole transport layer or hole injection layer) and a light emitting layer:

where X is a tetravalent aromatic hydrocarbon group, n is an integer of 1 to 10,000, and Y is where R1 and R2 are each independently a hydrogen or a monovalent $C_1$-$C_{15}$ organic group, W is a bond or where Ar is an aryl group, A is a bond or an aryl group, Z is a bond or an arylenyl group.

In Formula 1, Y may be any one selected from the followings:

where each R1 and each R2 are each independently a hydrogen or a monovalent $C_1$-$C_{15}$ organic group.

Preferred examples of X, which is a tetravalent aromatic hydrocarbon group, include:

-continued

-continued

Preferred polyimide having the triphenylamine derivative (TPD) unit is represented by Formula 2:

a hole injection layer from directly contacting with the light-emitting layer. In addition, the polyimide prevents electrons from being injected into the hole transport layer, thereby effectively preventing electrons from migrating from the light-emitting layer to the hole transport layer.

Also, since the polyimide containing triphenylamine derivative (TPD) unit is generally insoluble in a solvent such as toluene used in coating a light-emitting layer, any solvent can be selected in coating the light-emitting layer without limitation.

In Formula 1, n is an integer from 1 to 10,000, preferably from 1 to 1,000.

In Formula 1, $R_1$ and $R_2$ may be a hydrogen or a monovalent $C_1$-$C_{15}$ organic group. Examples of the monovalent

(2)

where X is a tetravalent aromatic hydrocarbon group, n is an integer of 1 to 10,000, each R1 and each R2 are each independently a hydrogen or a monovalent $C_1$-$C_{15}$ organic group.

In the polyimide containing the triphenylamine derivative (TPD) unit, since the TPD unit has excellent hole transporting capability, the polyimide serves as a buffer layer which prevents the PEDOT/PSS layer which is a hole transfer layer or $C_1$-$C_{15}$ organic group may include, but are not limited to, a substituted or unsubstituted alkyl, aryl, alkenyl, aralkyl, heteroalkyl, heteroaryl.

The polyimide containing the triphenylamine derivative (TPD) unit represented by Formula 2 can be prepared by reacting aromatic tetracarboxylic dianhydride of Formula 3 with a triphenylamine derivative represented by Formula 4:

(2)

(3)

(4)

where X is a tetravalent aromatic hydrocarbon group, n is an integer from 1 to 10,000, and R1 and R2 are each independently a hydrogen or a monovalent $C_1$-$C_{15}$ organic group.

The above preparation method can be expressed by the following reaction scheme 1:

The triphenylamine derivative of Formula 4 used in the present invention can be prepared by a general method. In detail, N,N'-diphenyl-N,N'-bis(4-aminophenyl)-1,1-biphenyl-4,4'-diamine can be prepared by the reaction scheme 2:

where X, n, $R_1$ and $R_2$ are defined as described in Formula 1.

In detail, aromatic tetracarboxylic dianhydride and the triphenylamine derivative mixed in a molar ratio of 1:1, concretely 5 to 30 wt %, preferably 10 to 20 wt %, are added to an organic solvent such as N,N-dimethylacetamide (DMAc), N-methyl-2-pyrrolidone (NMP), or dimethylacetamide (DMAc), and allowed to react with each other under a nitrogen atmosphere at a temperature ranging from 0 to 10° C. for about 4 to 20 hours, preferably for about 10 to about 15 hours, yielding a polyamic acid having such a repeating unit as shown in the above reaction scheme. Toluene was reacted in a solution of the polyamic acid under a nitrogen atmosphere at a temperature ranging from 150 to 180° C. for about 2 to 4 hours, thereby preparing a soluble polyimide having the TPD.

-continued

Specifically, 4,4'-dibromobiphenyl and 4-nitrodiphenylamine are reacted in a 1:2 molar ratio to obtain N'-diphenyl-N,N'-bis(4-nitrophenyl)-1,1-biphenyl-4,4'-diamine, which is then subjected to a reduction reaction, yielding N,N'-diphenyl-N,N'-bis(4-aminophenyl)-1,1-biphenyl-4,4'-diamine.

The polymer layer of the present invention is formed on a hole transport layer. After forming the hole transport layer on an anode, the obtained polyimide having a TPD unit represented by Formula 1 is dissolved in a solvent such as NMP, DMF, etc., for coating, thereby forming the electron blocking layer.

The polymer layer preferably has a thickness of 10 to 50 nm. If the thickness of the polymer layer is less than 10 nm, a desired electron end exciton blocking effect cannot be achieved. If the thickness of the polymer layer is greater than 30 nm, hole transporting efficiency undesirably deteriorates.

As described above, after forming the polymer layer, a light-emitting layer is subjected to solution-coating thereon. Since the polyimide having a TPD unit represented by Formula 1 is insoluble in a solvent such as toluene, any solvent can be selected, without limitation, in coating the light-emitting layer. In addition, since the polymer layer is not dissolved in the solvent while in use, thinning of the polymer layer does not occur. Thus, a change in the luminance of the organic EL device slowly proceeds over time.

Examples of usable materials from which the hole transport layer can be made include, without limitation, widely used hole transport layer materials, preferably PEDOT/PSS, polytriphenylamine, and so on.

Examples of usable materials from which the electron transport layer can be made include, without limitation, widely used electron transport layer materials, preferably polyoxadiazole.

The organic EL device according to the present invention may also include a hole blocking layer. Examples of usable materials from which the hole blocking layer can be made include, without limitation, widely used hole blocking layer materials, preferably LiF, $BaF_2$, $MgF_2$ and so on.

To manufacture the organic EL device according to the present invention, any particular apparatus or method is not needed. Rather, the organic EL device according to the present invention can be manufactured by a method for manufacturing an organic EL device using a general light-emitting material.

The present invention will be explained in more detail with reference to Examples that follow, but the following examples are for illustrative purposes only, and are not intended to limit the scope of the invention.

Example 1

Synthesis of Compound (A)

Synthesis of N,N'-diphenyl-N,N'-bis(4-aminophenyl)-1,1-biphenyl-4,4'-diamine

In a 100 mL three-necked flask were dissolved 1.56 g of 4,4'-dibromobiphenyl, 2.30 g of 4-nitrodiphenylamine, 1.44 g of sodium tert-butoxide and 0.51 g of tris(dibenzylideneacetone) dipalladium in 50 mL of p-xylene, followed by adding 0.3 mL of tri-t-butylphosphine to the resultant mixture, causing a reaction to take place under a nitrogen atmosphere at about 150° C. for about 16 hours. After the reaction was completed, a resultant solution was filtered to remove solid matter, and dissolved in excess chloroform. The salt was filtered using distilled water and the resultant solution was then concentrated. Then, purification was performed through column chromatography and recrystallization, acquiring 1.2 g of N,N'-diphenyl-N,N'-bis(4-nitrophenyl)-1,1-biphenyl-4, 4'-diamine in the form of powder. The acquired powder was dissolved in 50 mL ethanol, 1.5 mL hydrazine monohydrate was added thereto with a catalytic amount of 10% Pd/C, followed by refluxing for 24 hours, yielding 0.9 g of N,N'-diphenyl-N,N'-bis(4-aminophenyl)-1,1-biphenyl-4,4'-diamine.

Synthesis of Soluble Polyimide

In a three-necked flask were dissolved 1:1 molar ratio of 2,2-bis-(3,4-dicarboxyphenyl)hexafluoropropane dianhydride (6FDA) and N,N'-diphenyl-N,N'-bis(4-aminophenyl)-1,1-biphenyl-4,4'-diamine in NMP in a concentration of 10 wt %, causing a reaction to take place under a nitrogen atmosphere at a temperature in a range of 0-5° C. for about 16 hours for polymerization into polyamic acid. The polyamic acid was imidized at about 170° C. for about 4 hours, acquiring the subject compound. The acquired compound has a number average molecular weight of 12,520, a weight average molecular weight of 29,362, and polydispersity of 2.34.

Figure 3:
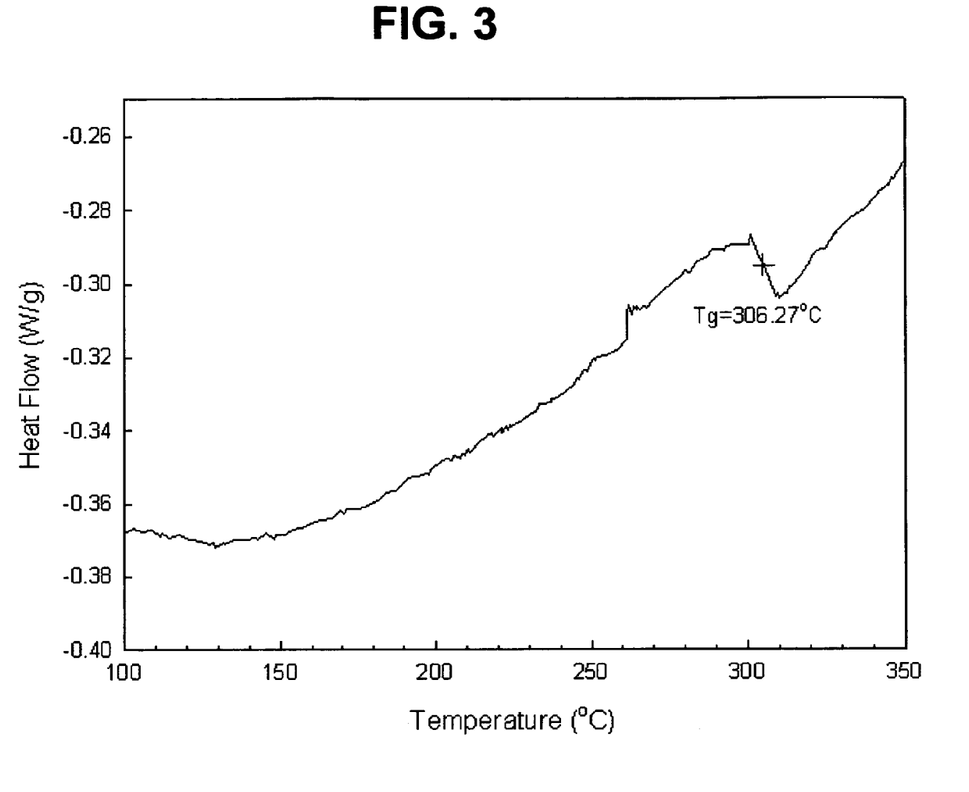
FIG. 3 is a thermogravimetric analysis (TGA) graph of polyimide having a TPD unit according to Example 1.
Figure 4:
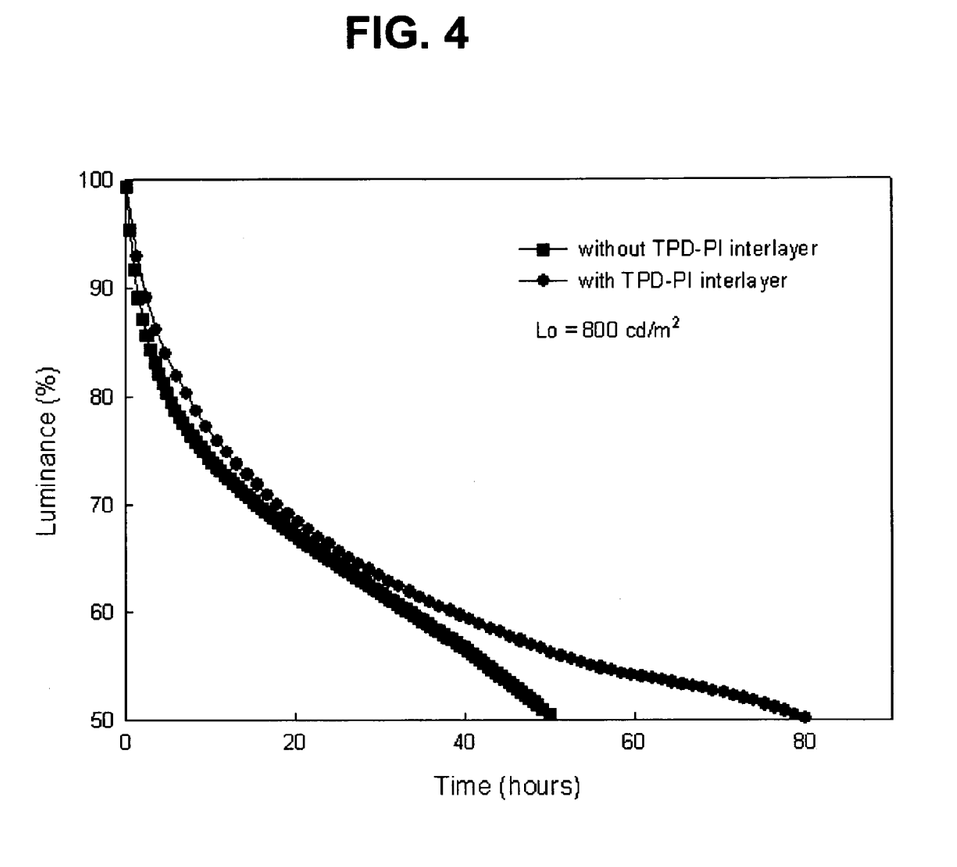
FIG. 4 is a graph illustrating a change in luminance over time for the organic EL device manufactured in Example 1.

FIG. 3 is a thermogravimetric analysis (TGA) graph of the compound (A). Referring to FIG. 3, it can be seen that the compound (A) has good thermal stability.

Figure 5A:
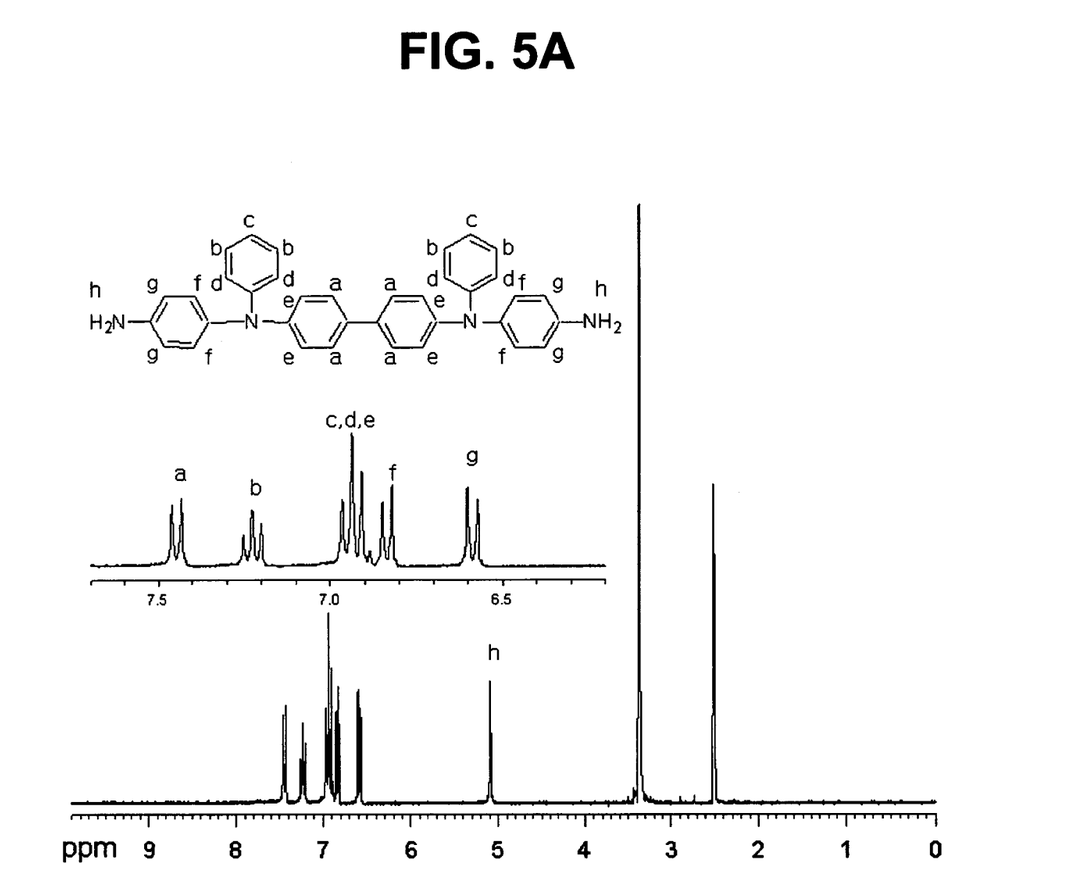
FIGS. 5A and 5B are a 1H-NMR (a) and 13C-NMR (b) spectra of DA-TPD according to Example 1 in DMSO-d6.
Figure 5B:
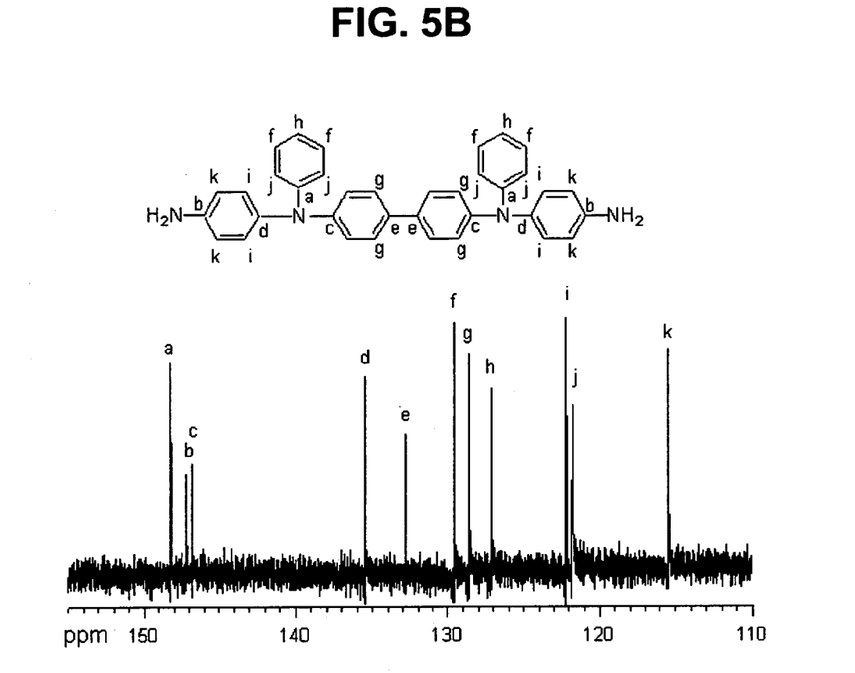
Figure 6:
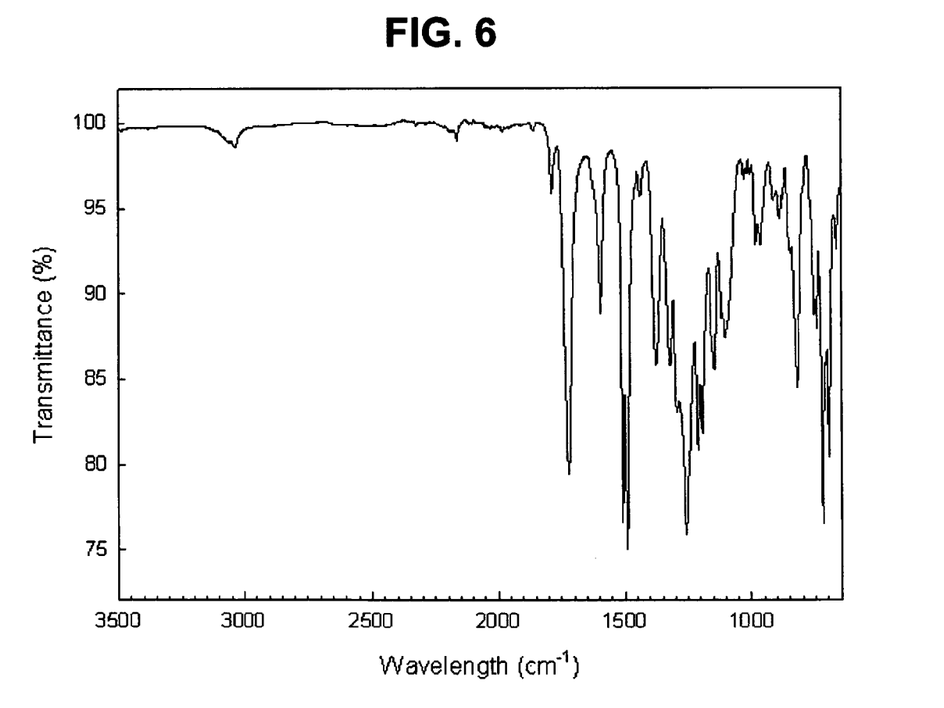
FIG. 6 is a FT-IR graph of TPD-PI according to Example 1.

Also, FIGS. 5 and 5B are a FT-IR graph of the compound (A).

Fabrication of Organic EL Device

First, the indium tin oxide (ITO) glass (obtained from Samsung Corning Co.) with a sheet resistance of 10 Ω/sq was patterned in a desirable form using a photoresist and etchant, and then cleaned by successive ultrasonic treatment in a detergent, acetone and isopropyl alcohol. Then, a PEDOT-PSS solution (H. C. Starck Batron P Al4083) was spin coated on the ITO layer to form a hole transport layer with a thickness of 50 nm and dried at 200° C. for 5 min in the globe box. The PEDOT-PSS is composed of PEDOT and PSS at the 1:6 weight ratio and the measured conductivity was $6.06 \times 10^{-4}$ S/cm. Next, 0.08 g of the compound (A), i.e., polyimide having a TPD unit represented by Formula 1, was dissolved in 9.92 g of DMF and coated on the resultant structure to a thickness of about 15 nm using a spin coater. Next, 0.8 wt % poly [2',3',6',7'-tetrakisoctyloxy spirofluorene-co-10-(4-octyloxy-phenyl)-10H-phenoxazine] was dissolved in 99.2 wt % m-xylene to prepare a composition for a light-emitting layer. The composition was spin coated on the buffer layer and baked in a vacuum oven to remove a solvent from the resultant material, thereby forming a polymer film. Prior to spin coating, the polymer solution was filtered using a 0.2 mm filter. A thickness of the polymer film was adjusted to be about 70 nm by adjusting a concentration of the polymer solution and a spin coating speed.

Subsequently, 4 nm $BaF_2$, 2.7 nm Ca, and 150 nm Al was sequentially deposited on the emissive layer using a vacuum depositor while maintaining a degree of vacuum at $4 \times 10^{-6}$ torr or less. During deposition, a thickness and a growing speed of a film were adjusted using a crystal sensor.

Comparative Example 1

An organic EL device was fabricated in the same manner as in Example 1, except for the polyimide layer not being formed.

Figure 1:
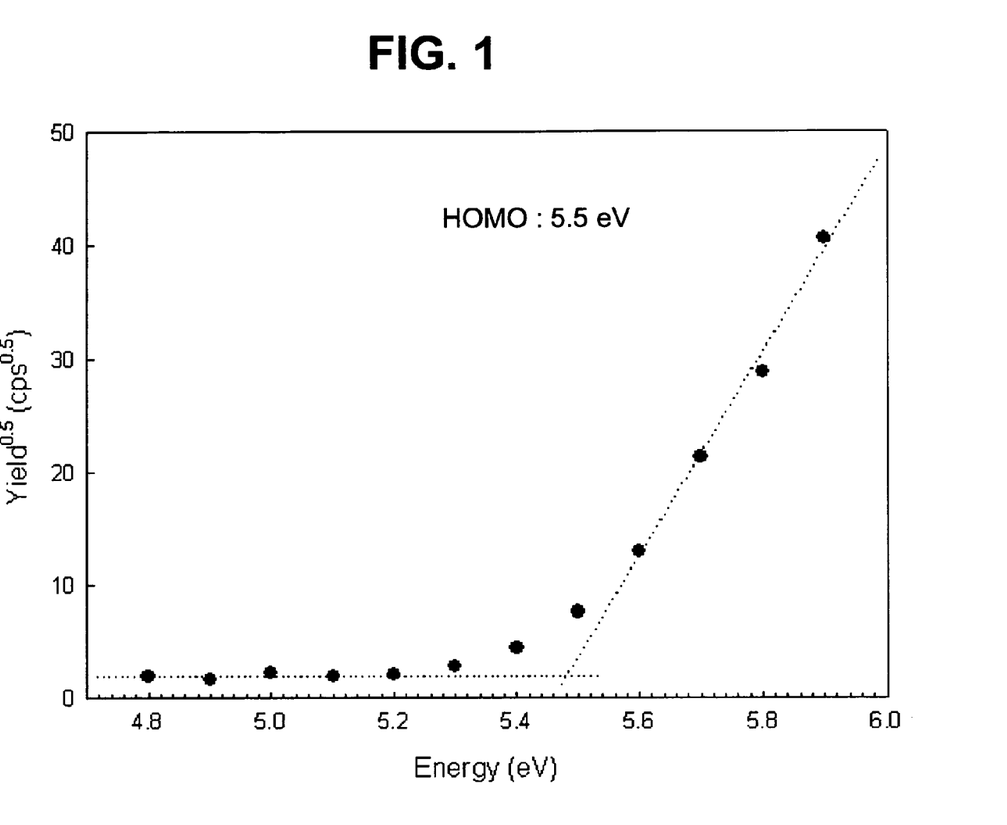
FIG. 1 is a graph illustrating analysis results of polyimide having a triphenylamine derivative (TPD) unit according to Example 1 using a photoelectron spectrometer in air (PESA, Riken Keiki Co. AC-2, Japan)
Figure 2:
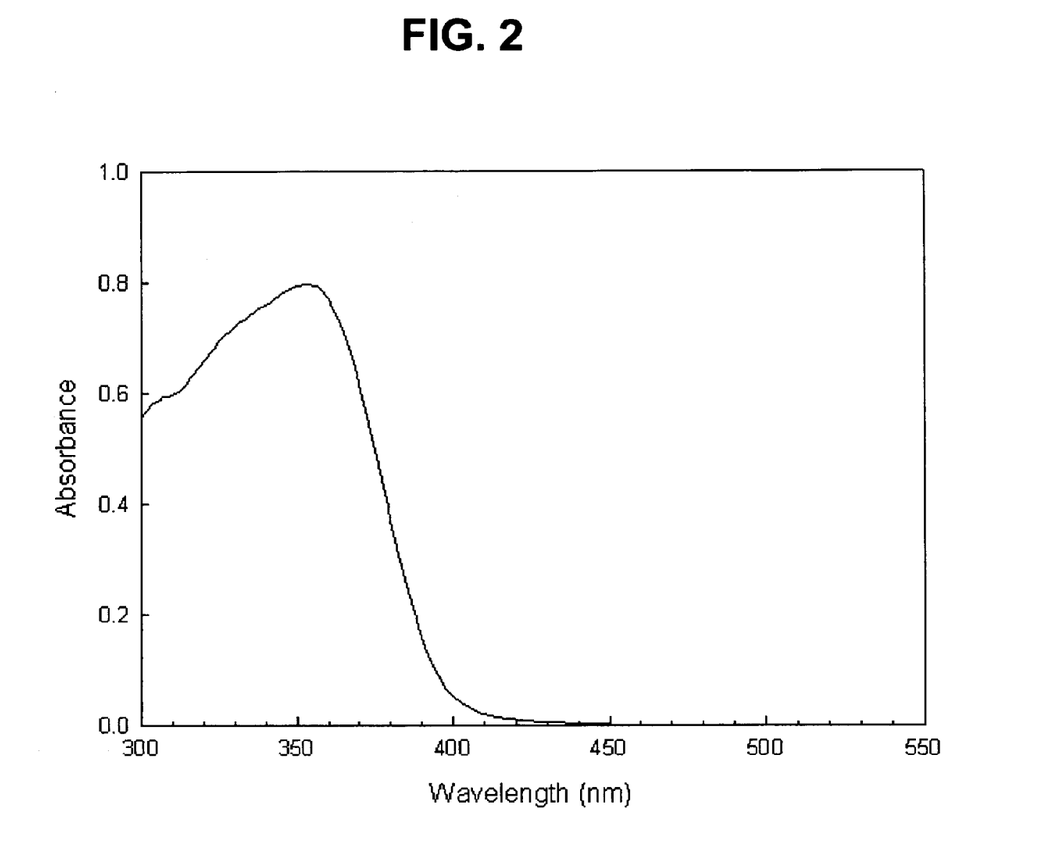
FIG. 2 shows UV-VIS absorption spectra of polyimide having a TPD unit according to Example 1.

FIGS. 1 and 2 illustrate HOMO and LUMO energy levels of the compound (A) prepared in Example 1, in which FIG. 1 is a graph illustrating the result of UV photoelectron spectroscopy analysis in air of the polyimide having a triphenylamine derivative (TPD) unit according to Example 1 using a photoelectron spectrometer in air (PESA, Riken Keiki Co. AC-2, Japan), and FIG. 2 is a graph illustrating UV/VIS spectral analysis. As can be seen from FIGS. 1 and 2, the HOMO and LUMO energy levels of the polyimide having a TPD unit according to Example 1 are 5.5 eV and 2.2 eV, respectively, which are suitable levels to be used as a material for the polymer layer.

Test Example

For the organic EL devices fabricated in Example and Comparative Example, changes in the luminance over time were measured using a luminance meter manufactured by Mcscience-JEIO Tech., and the measurement results are shown in FIGS. 5A and 5B. As shown in FIGS. 5A and 5B, the lifetime of the organic EL device with a TPD-PI layer used as an polymer layer significantly increases, i.e., about 60%, as compared to that of the organic EL device without using a layer.

Use of the polyimide containing the triphenylamine derivative (TPD) unit represented by Formula 1 as an polymer layer makes the polymer layer insoluble in a solvent used when coating the light-emitting layer, thereby adjusting a film thickness of the polymer layer. In addition, any solvent can be selected in coating the light-emitting layer without limitation. Further, since electron and exciton injection from the light-emitting layer to the hole transport layer is prevented, the organic EL device exhibits good luminance efficiency even after a prolonged period use, ultimately leading to enhanced life characteristics.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic electroluminescent device, comprising:
   a first electrode;
   a second electrode;
   a light emitting layer between the first electrode and the second electrode;
   a hole transport layer between the light emitting layer and the first electrode;
   a hole injection layer between the hole transport layer and the first electrode; and
   a polymer layer comprising a polyimide having a triphenylamine derivative unit represented by Formula 1 between the hole transport layer and the light emitting layer:

(1)

where X is a tetravalent aromatic hydrocarbon group, n is an integer of 1 to 10,000, and Y is where R1 and R2 are each independently a hydrogen or a monovalent $C_1$-$C_{15}$ organic group, W is a bond or where Ar is an aryl group, A is a bond or an aryl group, and Z is a bond or an arylenyl group.

2. The organic electroluminescent device of claim 1, wherein at least one of the hole transport layer and the hole injection layer is a poly(3,4-ethylenedioxythiophen)/polystyrene sulfonate layer.

3. The organic electroluminescent device of claim 1, wherein Y is any one selected from the group consisting of:

where each R1 and each R2 are each independently a hydrogen or a monovalent $C_1$-$C_{15}$ organic group.

4. The organic electroluminescent device of claim 1, wherein X is any one selected from the group consisting of:

-continued

-continued

5. The organic electroluminescent device of claim 1, wherein the polymer layer has a thickness in the range of about 10 nm to about 50 nm.

6. The organic electroluminescent device of claim 1, wherein the polyimide is represented by Formula 2:

(2)

where X is a tetravalent aromatic hydrocarbon group, n is an integer of 1 to 10,000, and each $R_1$ and each $R_2$ are each independently a hydrogen or a monovalent $C_1$-$C_{15}$ organic group.

7. The organic electroluminescent device of claim 1, wherein n is 1 to 1,000.

8. The organic electroluminescent device of claim 1, wherein the monovalent $C_1$-$C_{15}$ organic group is a substituted or unsubstituted alkyl group, a substituted or unsubstituted aryl group, a substituted or unsubstituted alkenyl group, a substituted or unsubstituted aralkyl group, a substituted or unsubstituted heteroalkyl group, or a substituted or unsubstituted heteroaryl group.

9. A polyimide for an interlayer of an organic electroluminescent device, the polyimide represented by Formula 1:

(1)

where X is selected from the group consisting of the following formulae:

-continued

Y is where $R_1$ and $R_2$ are each independently a hydrogen or a monovalent $C_1$-$C_{15}$ organic group, W is a bond, and Z is a bond or an arylenyl group;

N is an integer of 1 to 10,000.

10. The polyimide of claim 9, wherein X is

11. An organic electroluminescent device having a polymer layer of the polyimide of claim 9.

12. A method of making a polymer layer for an organic electroluminescent device, the method comprising the utilizing the polyimide of claim 9 for the polymer layer.

13. A polyimide for an interlayer of an organic electroluminescent device, the polyimide represented by Formula 2 prepared by reacting a tetracarboxylic dianhydride represented by Formula 3 with a triphenylamine derivative represented by Formula 4:

wherein n is an integer from 1 to 10,000, each $R_1$ and each $R_2$ are each independently a hydrogen or a monovalent $C_1$-$C_{15}$ organic group, and X is selected from the group consisting of:

-continued

* * * * *